US011158965B2

(12) United States Patent
Ho

(10) Patent No.: US 11,158,965 B2
(45) Date of Patent: Oct. 26, 2021

(54) CONNECTING MODULE AND ELECTRONIC DEVICE

(71) Applicant: Wistron Corp., New Taipei (TW)

(72) Inventor: Zong Han Ho, New Taipei (TW)

(73) Assignee: WISTRON CORP., New Taipei (TW)

( * ) Notice: Subject to any disclaimer, the term of this patent is extended or adjusted under 35 U.S.C. 154(b) by 82 days.

(21) Appl. No.: 16/709,007

(22) Filed: Dec. 10, 2019

(65) Prior Publication Data

US 2021/0057836 A1 Feb. 25, 2021

(30) Foreign Application Priority Data

Aug. 23, 2019 (TW) .................................. 108130164

(51) Int. Cl.
| | | |
|---|---|---|
| *H01R 13/62* | (2006.01) | |
| *H01R 12/70* | (2011.01) | |
| *H01R 12/72* | (2011.01) | |
| *H01R 12/71* | (2011.01) | |

(52) U.S. Cl.
CPC ....... *H01R 12/7005* (2013.01); *H01R 12/716* (2013.01); *H01R 12/721* (2013.01)

(58) Field of Classification Search
CPC .............. H01R 23/068; H01R 23/7068; H01R 23/7005; H01R 13/6215; H01R 12/7005; H01R 12/716; H01R 12/721; G06K 13/08; G06F 1/184; G06F 1/187
USPC .................. 439/59, 60, 64, 159, 362, 928.1; 361/679.39
See application file for complete search history.

(56) References Cited

U.S. PATENT DOCUMENTS

| | | | | |
|---|---|---|---|---|
| 5,860,828 A | * | 1/1999 | Anderson .......... | H01R 12/7005 439/377 |
| 6,831,832 B2 | * | 12/2004 | Haager ................ | H05K 7/1461 361/679.35 |
| 6,991,480 B2 | * | 1/2006 | Katayanagi .......... | G06K 7/0043 439/159 |
| 7,040,908 B2 | * | 5/2006 | Kamata .............. | H01R 13/6335 439/159 |
| 7,108,530 B2 | * | 9/2006 | Kimura ................ | G06K 7/0013 439/218 |
| 7,257,886 B2 | * | 8/2007 | Haager ................ | H05K 7/1461 29/739 |
| 7,258,554 B1 | * | 8/2007 | Yang ..................... | G06F 13/409 361/741 |

(Continued)

FOREIGN PATENT DOCUMENTS

TW           M432234 U       6/2012

*Primary Examiner* — Thanh Tam T Le

(57) ABSTRACT

A connecting module is provided, including a housing, a circuit board, a sliding member, a first guiding member, and a second guiding member. The housing has an inserting portion. The circuit board is disposed on the housing, and includes a first connecting port and a second connecting port. The sliding member is movably disposed on the housing. The first guiding member is disposed between the inserting portion and the first connecting port. The second guiding member is disposed on the sliding member and situated between the inserting portion and the second connecting port. Owing to the aforementioned structure, different electronic members can connect to the first connecting port and the second connecting port. The connecting module can therefore support different electronic members.

20 Claims, 16 Drawing Sheets

(56) References Cited

U.S. PATENT DOCUMENTS

| | | | | |
|---|---|---|---|---|
| 7,381,074 B1* | 6/2008 | Bridges | G06F 1/185 | 439/325 |
| 7,567,440 B2* | 7/2009 | Huang | G11B 33/12 | 361/679.37 |
| 7,918,678 B2* | 4/2011 | Cole | H01R 13/627 | 439/328 |
| 8,339,781 B2* | 12/2012 | Zhang | H05K 7/1489 | 361/679.39 |
| 8,373,983 B2* | 2/2013 | Zhang | H05K 7/1491 | 361/679.33 |
| 8,393,908 B2* | 3/2013 | Li | G06K 13/0806 | 439/159 |
| 8,764,457 B2* | 7/2014 | Chen | H05K 7/142 | 439/65 |
| 8,811,022 B2* | 8/2014 | Liang | H04M 1/0235 | 361/749 |
| 8,882,531 B2* | 11/2014 | Kuo | H01R 12/724 | 439/372 |
| 8,939,780 B2* | 1/2015 | Liang | H01R 13/4538 | 439/157 |
| 9,015,931 B2* | 4/2015 | Boetzer | H05K 7/1461 | 29/831 |
| 9,019,711 B2* | 4/2015 | Tamura | H05K 7/1418 | 361/752 |
| 9,192,073 B2* | 11/2015 | Fu | H05K 7/1409 | |
| 9,280,186 B2* | 3/2016 | Yang | H05K 7/1487 | |
| 9,948,015 B2* | 4/2018 | Zhu | H04B 1/3818 | |

* cited by examiner

CONNECTING MODULE AND ELECTRONIC DEVICE

CROSS REFERENCE TO RELATED APPLICATIONS

This application claims the benefit of Taiwan Patent Application No. 108130164, filed Aug. 23, 2019, the entirety of which is incorporated by reference herein.

BACKGROUND OF THE INVENTION

Field of the Invention

The application relates in general to a connecting module, and in particular, to a connecting module having connecting ports.

Description of the Related Art

With rapid developments in technology, desktop computers, notebook computers, and other types of electronic devices are widely used. The aforementioned electronic devices usually have connectors to connect different types of electronic members, such as a network interface controller or a video card. However, the same type of electronic members may have different dimensions. Electronic devices nowadays need to have the ability to support different types of electronic members to enhance their market competitiveness. Therefore, how to address the aforementioned problem has become an important issue.

BRIEF SUMMARY OF INVENTION

To address the deficiencies of conventional products, an embodiment of the invention provides a connecting module, including a housing, a circuit board, a sliding member, a first guiding member, and a second guiding member. The housing has an inserting portion. The circuit board is disposed on the housing, and includes a first connecting port and a second connecting port, wherein the first connecting port and the second connecting port face the inserting portion. The sliding member is movably disposed on the housing. The first guiding member is disposed between the inserting portion and the first connecting port, and the second guiding member is disposed on the sliding member and disposed between the inserting portion and the second connecting port.

In some embodiments, the second guiding member is parallel to the first guiding member.

In some embodiments, the inserting portion is divided into a first region and a second region, the first region corresponds to the first connecting port, and the second region corresponds to the second connecting port, wherein in response to the sliding member being in a first position, the sliding member covers the second region.

In some embodiments, the connecting module further includes a fixed member affixed to the housing and having a restricting portion, and the sliding member has an engaged portion, wherein in response to the sliding member being in the first position, the restricting portion is joined to the engaged portion. For example, the restricting portion is a spring sheet, and the engaged portion is a recess. In some embodiments, the restricting portion is a recess, and the engaged portion is a spring sheet.

In some embodiments, in response to the sliding member being in a second position, the sliding member does not cover the second region, and the second connecting port is disposed between the first guiding member and the second guiding member.

In some embodiments, the fixed member has a blocking portion, and the sliding member has an additional engaged portion. In response to the sliding member being in the second position, the restricting portion is joined to the additional engaged portion, and the sliding member contacts the blocking portion to restrict the sliding member from moving in the first direction.

In some embodiments, the housing has a protrusion, and in response to the sliding member being in the first position, the protrusion contacts the sliding member to restrict the sliding member from moving in the second direction, wherein the second direction is opposite the first direction.

In some embodiments, the sliding member has a guiding slot, and the connecting module further includes a guiding pillar disposed on the housing and movably accommodated in the guiding slot. The guiding pillar has a T-shaped structure.

In some embodiments, the first guiding member is affixed to the circuit board and fixed relative to the housing. The second guiding member has a protruding portion, protruding from the circuit board. A gap is formed between the circuit board and the housing, and at least a portion of the sliding member is disposed in the gap.

In some embodiments, the connecting module further comprises an additional sliding member movably disposed on the housing, and the first guiding member is disposed on the additional sliding member. The circuit board further comprises a third connecting port, the inserting portion is divided into a first region, a second region, and a third region, the first region corresponds to the first connecting port, the second region corresponds to the second connecting port, and the third region corresponds to the third connecting port. The additional sliding member can cover the third region, and the first connecting port is disposed between the second connecting port and the third connecting port.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the connecting module are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
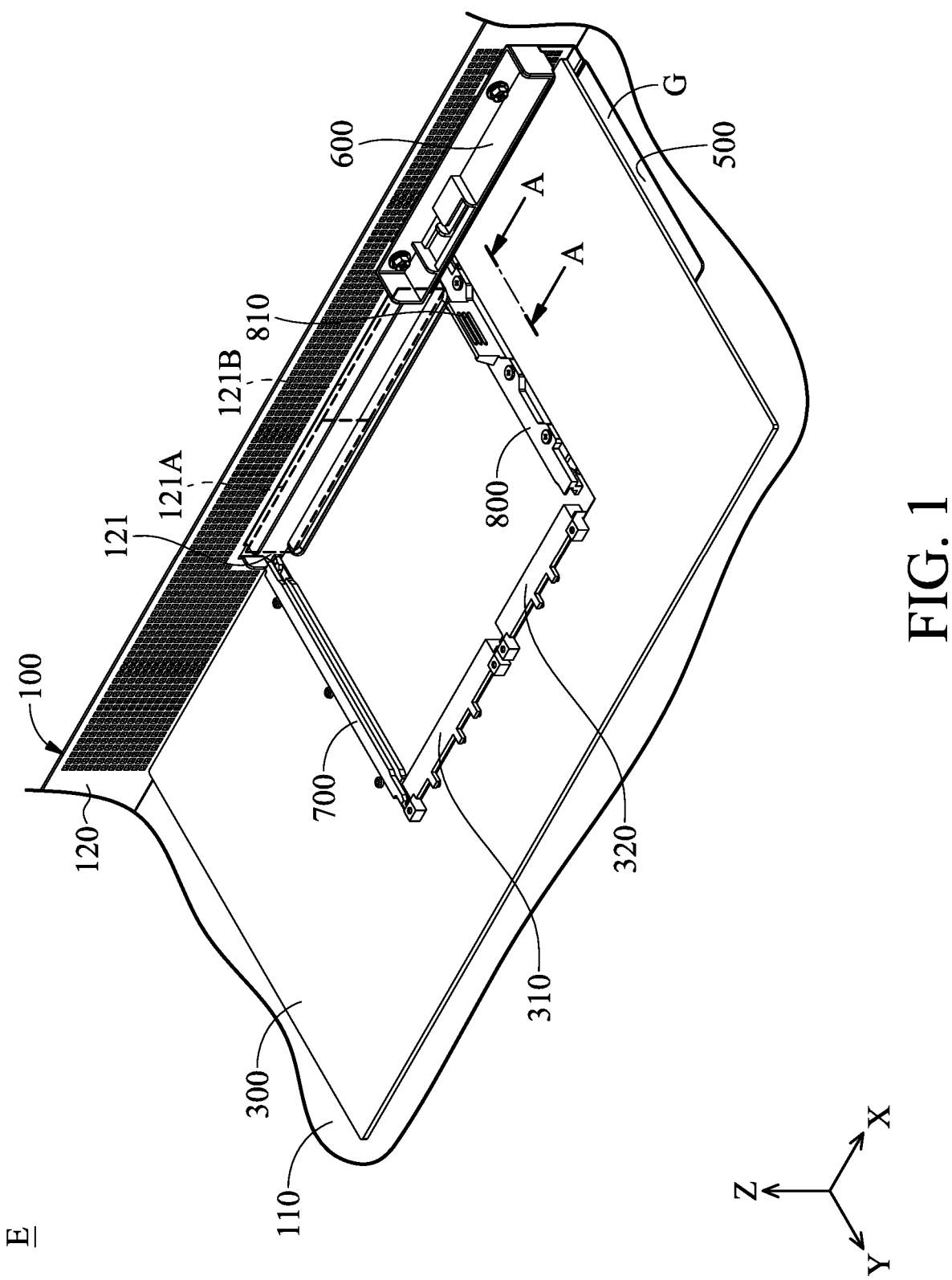
FIG. 1 is a schematic diagram of a connecting module according to an embodiment of the invention.
Figure 2:
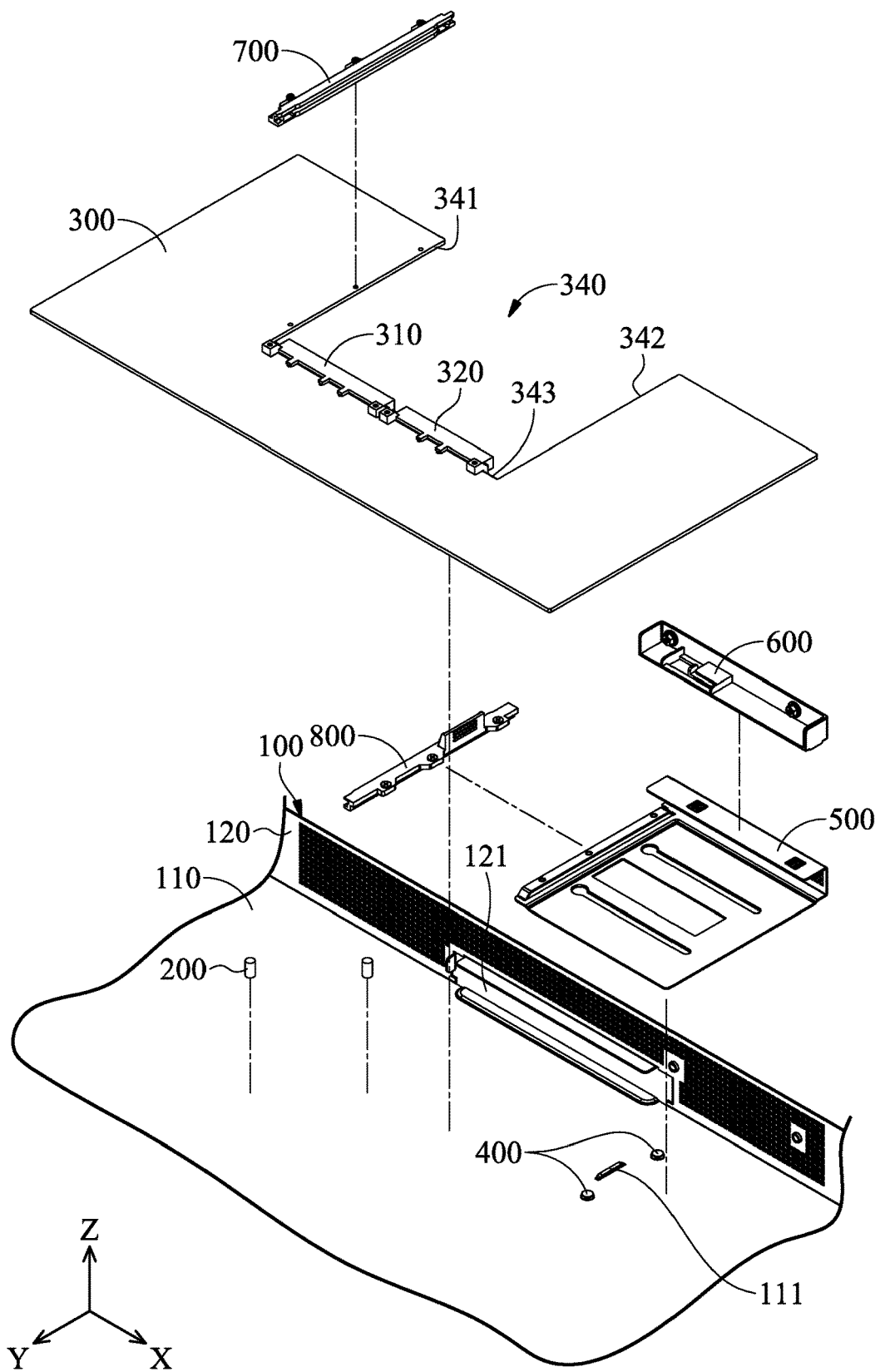
FIG. 2 is an exploded-view diagram of the connecting module according to an embodiment of the invention.
Figure 3:
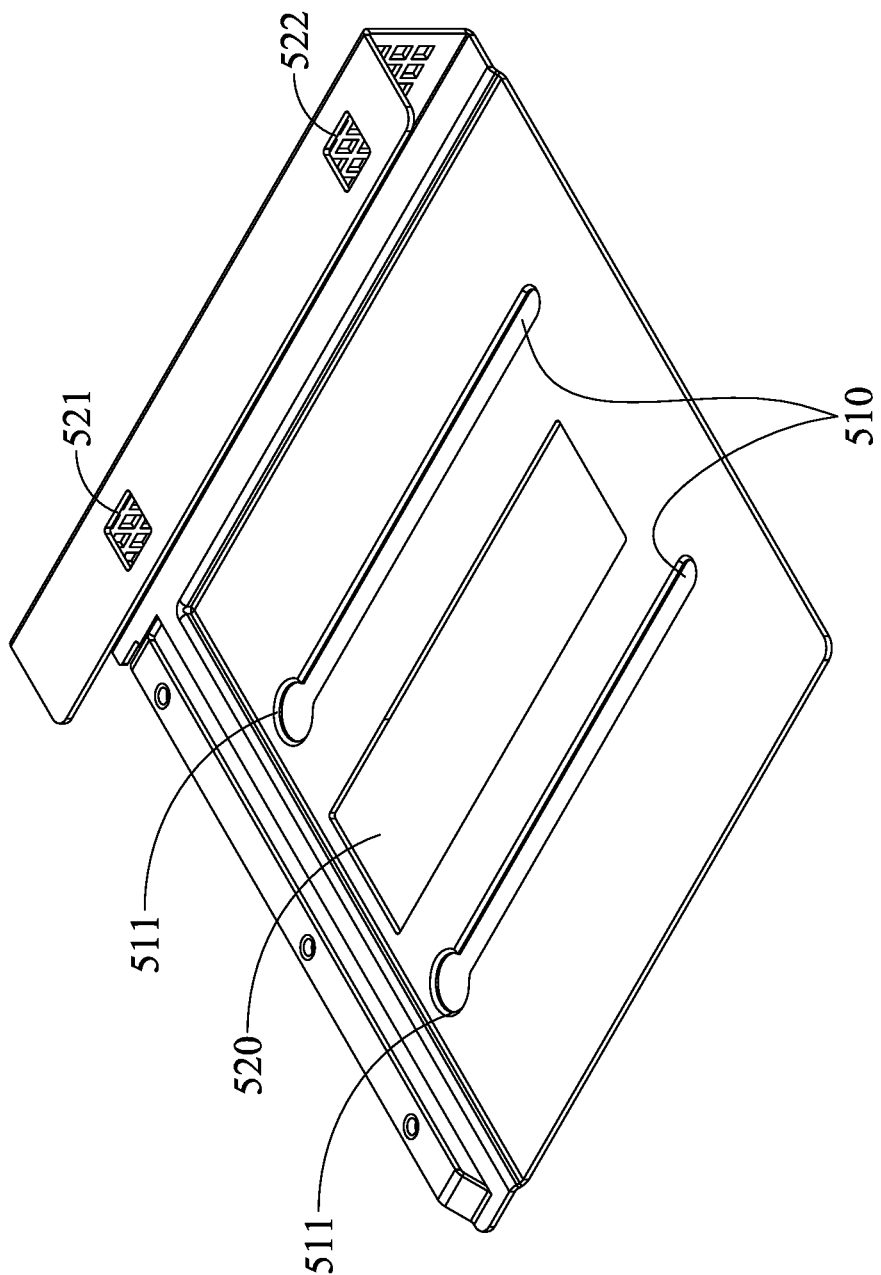
FIG. 3 is a schematic diagram of a sliding member according to an embodiment of the invention.

FIG. 1 is a schematic diagram of a connecting module E according to an embodiment of the invention, and FIG. 2 is an exploded-view diagram of the connecting module E. As shown in FIGS. 1 and 2, the connecting module E primarily includes a housing 100, a plurality of supporting members 200, a circuit board 300, at least one guiding pillar 400, a sliding member 500, a fixed member 600, a first guiding member 700, and a second guiding member 800. For example, the connecting module E can be a desktop computer, a notebook computer, or a server.

It should be noted that, for clearly representing the relationship between the aforementioned members, a portion of the housing 100 is omitted in FIGS. 1 and 2. The appearance of the housing 100 can be selected according to the requirement. For example, the housing 100 can be a closed hollow box, and the circuit board 300, the guiding pillar 400, the sliding member 500, the fixed member 600, the first guiding member 700, and the second guiding member 800 can be accommodated in the hollow box.

The housing 100 has a bottom plate 110 and a lateral wall 120 connected to each other. The supporting members 200 are affixed to the bottom plate 110, and the circuit board 300 is disposed on the supporting members 200. For example, the supporting members 200 can be copper pillars. Owing to the support of the supporting members 200, the circuit board 300 can be separated from the bottom plate 110 by a gap G to prevent the circuit board 300 from directly contacting the housing 100 to cause a short circuit.

The circuit board 300 has a first connecting port 310 and a second connecting port 320, and an inserting portion is formed on the lateral wall 120 of the housing 100. For example, the inserting portion can be an opening, but it is not limited thereto. The positions of the first connecting port 310 and the second connecting port 320 correspond to the inserting portion 121, and the insertion openings of the first and the second connecting ports 310 and 320 face the inserting portion 121.

In this embodiment, the circuit board 300 has a slot 340 corresponding to the inserting portion 121 of the housing 100. The slot 340 has a first side 341, a second side 342, and a third side 343. The third side 343 is connected to the first side 341 and the second side 342. The first side 341 and the second side 342 extend along the Y-axis, and the third side 343 extends along the X-axis. The first connecting port 310 and the second connecting port 320 are disposed on the third side 343 of the slot 340. The inserting portion 121 can be divided into a first region 121A and a second region 121B, wherein the first region 121A and the second region 121B respectively corresponds to the first connecting port 310 and the second connecting port 320.

Referring to FIGS. 1-4, the guiding pillar 400 is affixed to the bottom plate 110 of the housing 100, and the sliding member 500 has at least one guiding slot 510. The guiding pillar 400 is movably connected to the guiding slot 510. Therefore, the sliding member 500 can movably connect to the housing 100 via the guiding pillar 400. The longitudinal direction of the guiding slot 510 is substantially parallel to the X-axis, so that the sliding member 500 can move along the X-axis relative to the housing 100.

Figure 4:
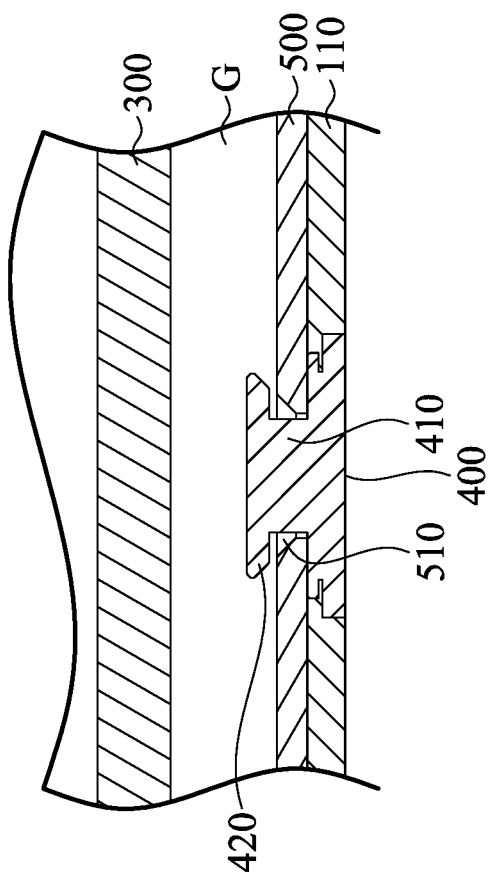
FIG. 4 is a cross-sectional view along line A-A in FIG. 1.
Figure 4:
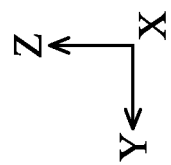

It should be noted that, in this embodiment, the guiding pillar 400 includes a T-shaped structure (as shown in FIG. 4), and the T-shaped structure has a sliding section 410 and a restricting section 420. The sliding section 410 is connected to the bottom plate 110 and the restricting section 420, and the dimensions of the restricting section 420 are greater than the sliding section 410. The guiding slot 510 of the sliding member 500 has the same dimensions as the restricting section 420 only at one end 511, and the remaining portion has the same width as the sliding section 410. Therefore, when the guiding pillar 400 is engaged with the guiding slot 510, the sliding member 500 can be prevented from being separated from the housing 100 along the Z-axis (or the Y-axis).

Furthermore, at least a portion of the sliding member 500 is disposed in the gap G, which is situated between the circuit board 300 and the bottom plate 110, so as to avoid the sliding member 500 impacting the electronic components on the circuit board 300, and effectively use the space.

Referring to FIGS. 1-4, the sliding member 500 further includes an accommodating portion 520 and two engaged portions 521 and 522, and a protrusion 111 is formed on the bottom plate 110. The protrusion 111 is accommodated in the accommodating portion 520, so as to restrict the range of movement of the sliding member 500. Two engaged portions 521 and 522 are arranged along the X-axis. In this embodiment, the engaged portions 521 and 522 are recesses.

Figure 5:
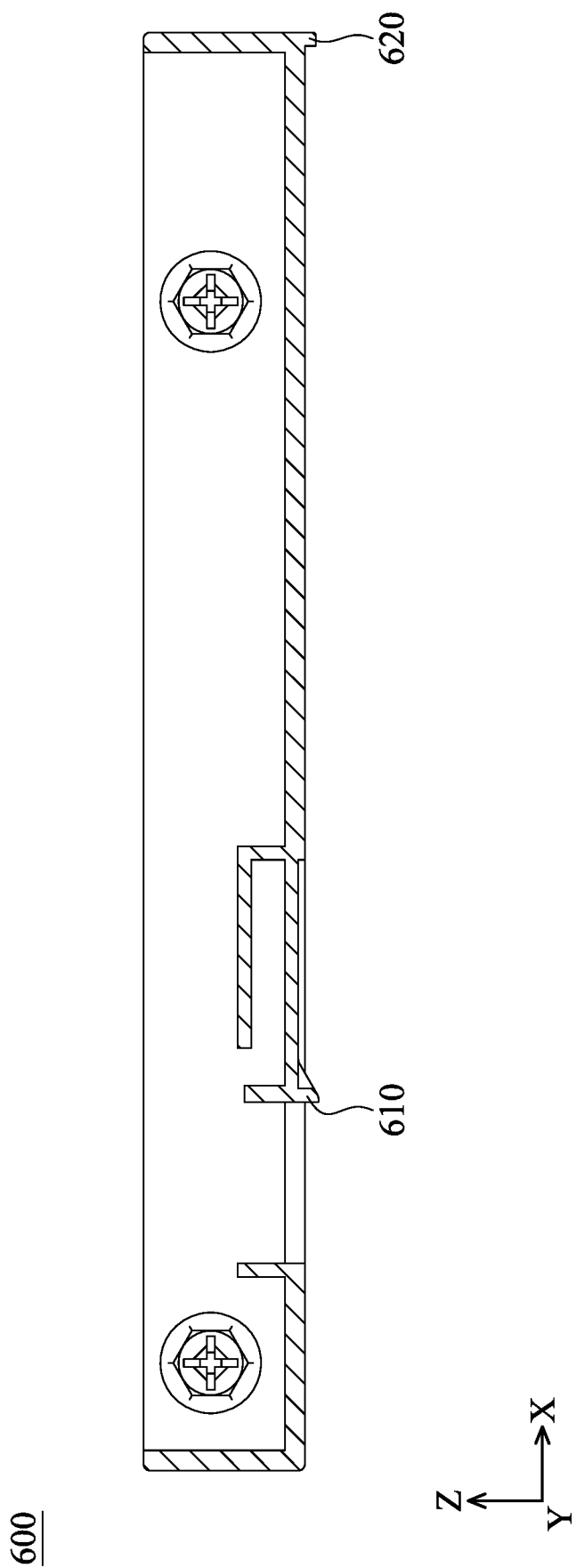
FIG. 5 is a cross-sectional view of a fixed member according to an embodiment of the invention.

As shown in FIGS. 1, 2 and 5, the fixed member 600 is affixed to the lateral wall 120 of the housing 100, and includes a positioning portion 610 and a blocking portion 620. When the sliding member 500 and the fixed member 600 are disposed on the housing 100, the position of the positioning portion 610 corresponds to the positions of the engaged portions 521 and 522. In other words, the restricting portion 610 and the engaged portions 521 and 522 are arranged along the X-axis. In this embodiment, the restricting portion 610 is a spring sheet extending toward the sliding member 500. The blocking portion 620 protrudes from the bottom surface of the fixed member 600 (the surface faces the bottom plate 110).

The first guiding member 700 and the second guiding member 800 are parallel and respectively disposed on the circuit board 300 and the sliding member 500. In particular, the first guiding member 700 is affixed to the first side 341 of the circuit board 300, and disposed between the inserting portion 121 and the first connecting port 310. The second guiding member 800 is disposed between the inserting portion 121 and the second connecting port 320, and can move between the first side 341 and the second side 342. The guiding groove of the first guiding member 700 faces the guiding groove of the second guiding member 800, and the guiding grooves of the first guiding member 700 and the second guiding member 800 extend along the Y-axis. The second guiding member 800 has a protruding portion 810 protruding from the circuit board 300. The user can push the protruding portion 810 to move the sliding member 500.

In some embodiments, the first guiding member 700 can be affixed directly to the bottom plate 110 of the housing 100.

Figure 6A:
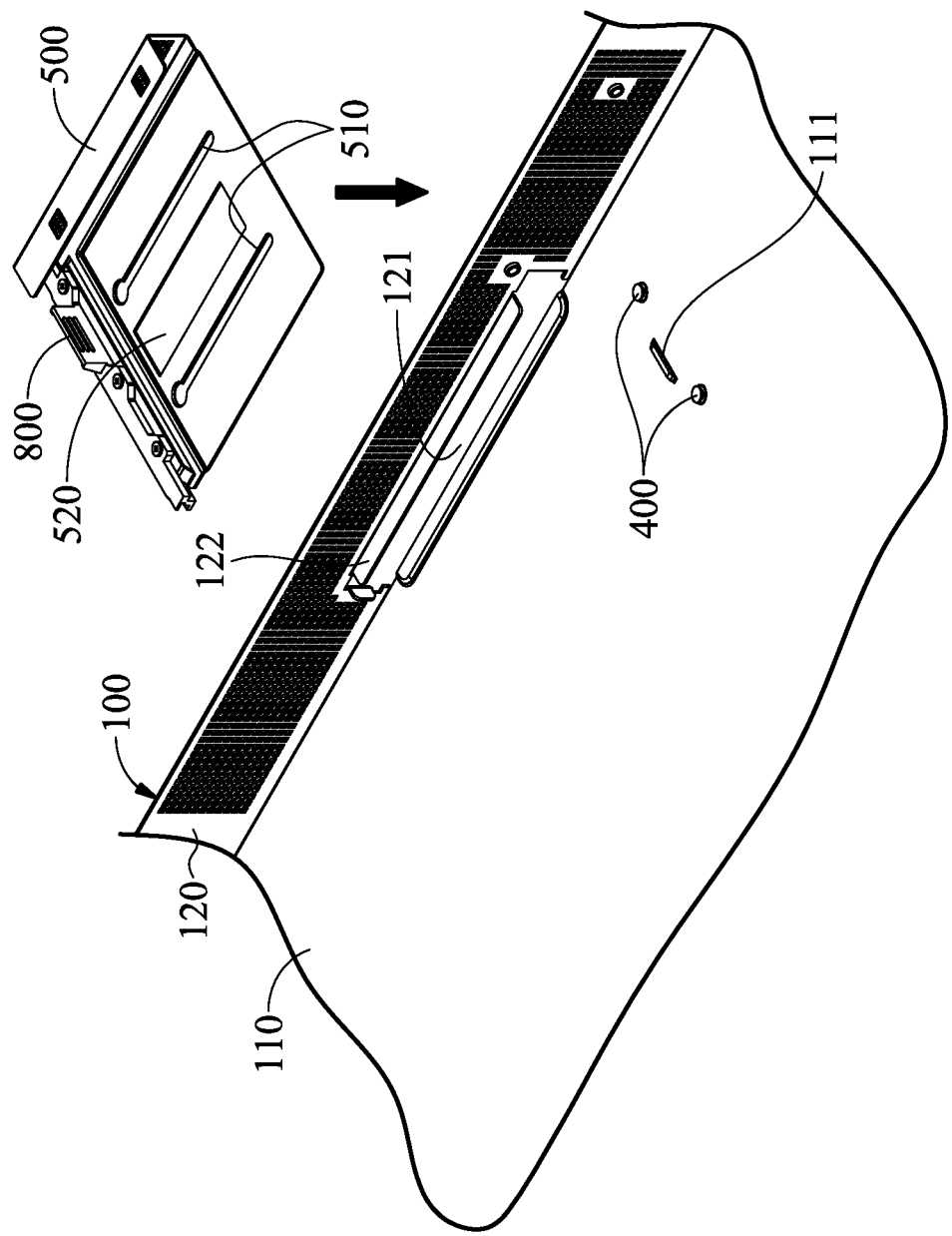
FIGS. 6A-6C are schematic diagrams of the assembly step of the connecting module according to an embodiment of the invention.
Figure 6B:
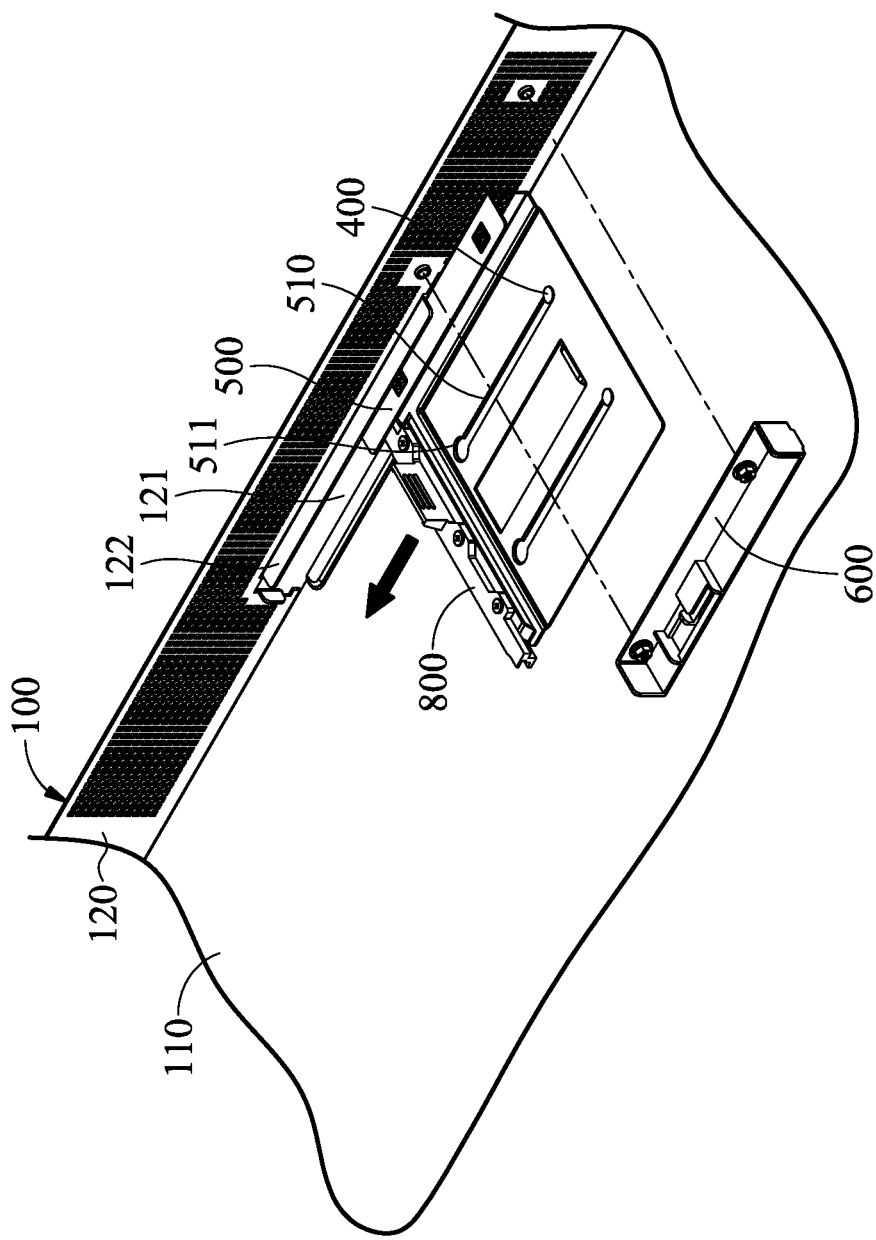
Figure 6C:
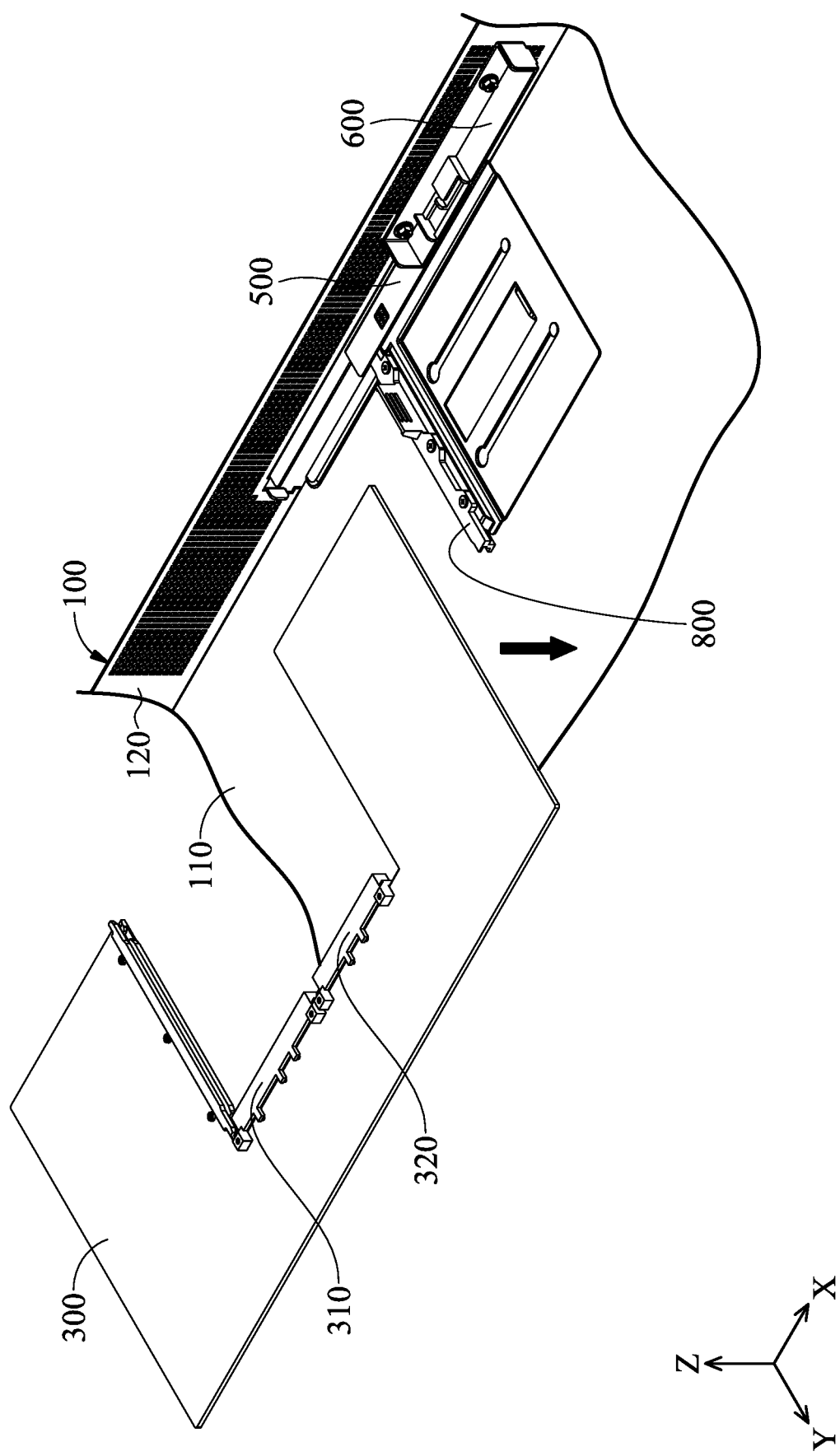

Referring to FIGS. 6A-6C, the assembly method of the connecting module E is discussed below. First, as shown in FIG. 6A, the guiding pillar is affixed to the bottom plate 100 and the second guiding member 800 is affixed to the sliding member 500. The guiding pillar 400 enters the guiding slot 510, so that the sliding member 500 can be movably connected to the housing 100.

Subsequently, as shown in FIG. 6B, the fixed member 600 can be affixed to the lateral wall 120 of the housing 100. Since the sliding member 500 is disposed between the fixed member 600 and the bottom plate 110, the sliding member 500 can be prevented from being separated from the housing 100 even when the guiding pillar 400 is situated at the end 511 of the guiding slot 510. Furthermore, during the movement of the sliding member 500 relative to the housing 100, in addition to the guide pillar 400 can prevent the sliding member 500 from being separated from the housing 100, in this embodiment, the lateral wall 120 also has a shield 122 adjacent to the inserting portion 121. During the movement of the sliding member 500, the sliding member 500 is situated between the shield 122 and the bottom plate 110, thereby can further prevent the sliding member 500 from being separated from the housing 100.

Finally, as shown in FIG. 6C, the circuit board 300 can be assembled on the housing 100 via the supporting members 200, and the first guiding member 700 can be affixed to the circuit board 300. The connecting module E can be assembled according to the aforementioned steps.

Figure 7A:
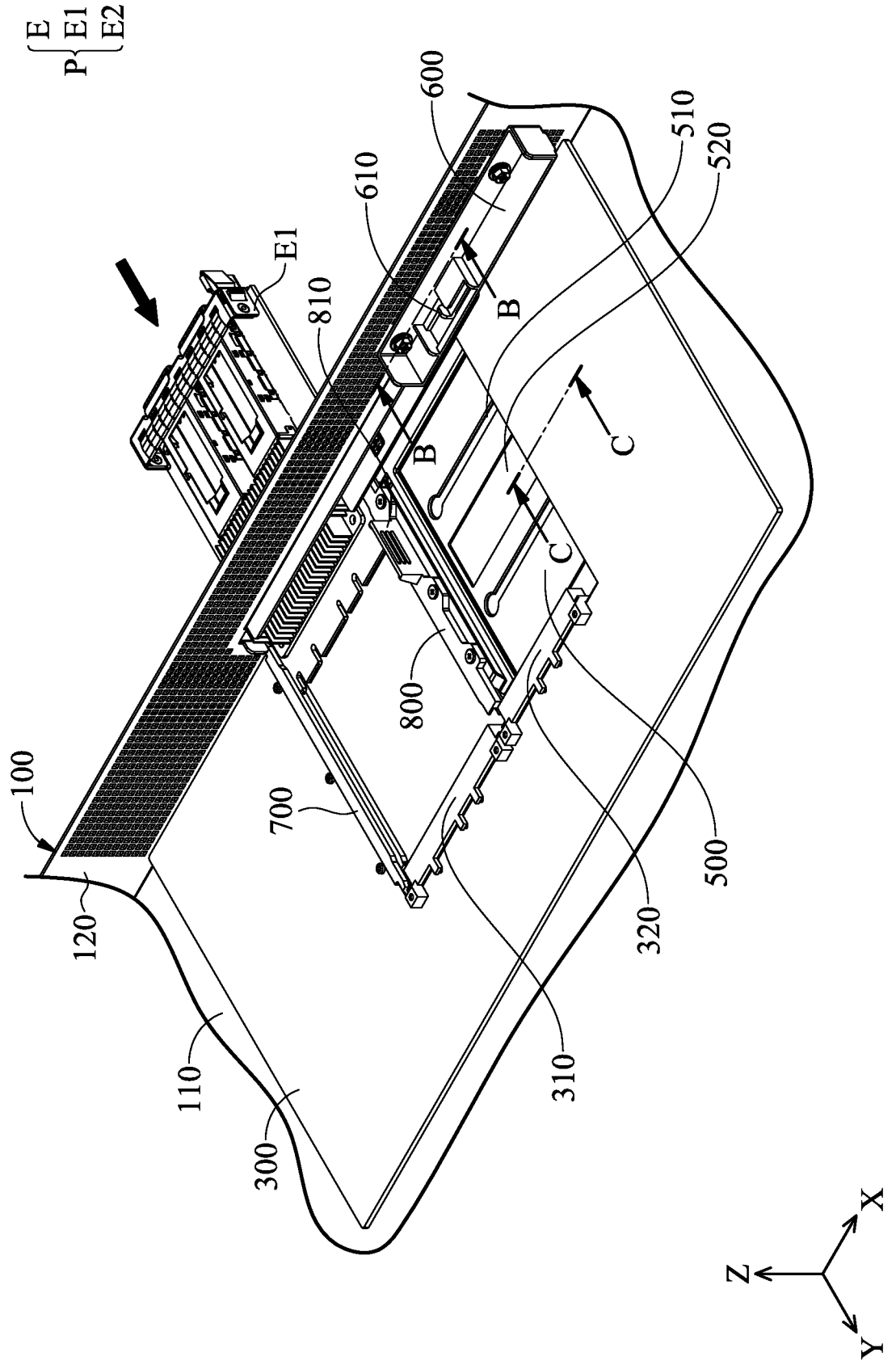
FIG. 7A is a schematic diagram of the sliding member in the first position according to an embodiment of the invention.

Referring to FIGS. 7A-8C, the connecting module E can be used in an electronic device P. The electronic device P further includes different types of electronic members (such as electronic member E1 and/or electronic member E2 In other words, in this embodiment, the electronic device P includes the connecting module E and the electronic members E1 and E2). As shown in FIG. 7A, when the user desires to connect the electronic member E1 to the first connecting port 310, the sliding member 500 can be disposed in a first position. At this time, the first connecting port 310 is disposed between the first guiding member 700 and the second guiding member 800, and the sliding member 500 covers the second region 121B of the inserting portion 121. The electronic member E1 can move along the Y-axis through the guiding grooves of the first guiding member 700 and the second guiding member 800, and connect to the first connecting port 310.

Figure 7B:
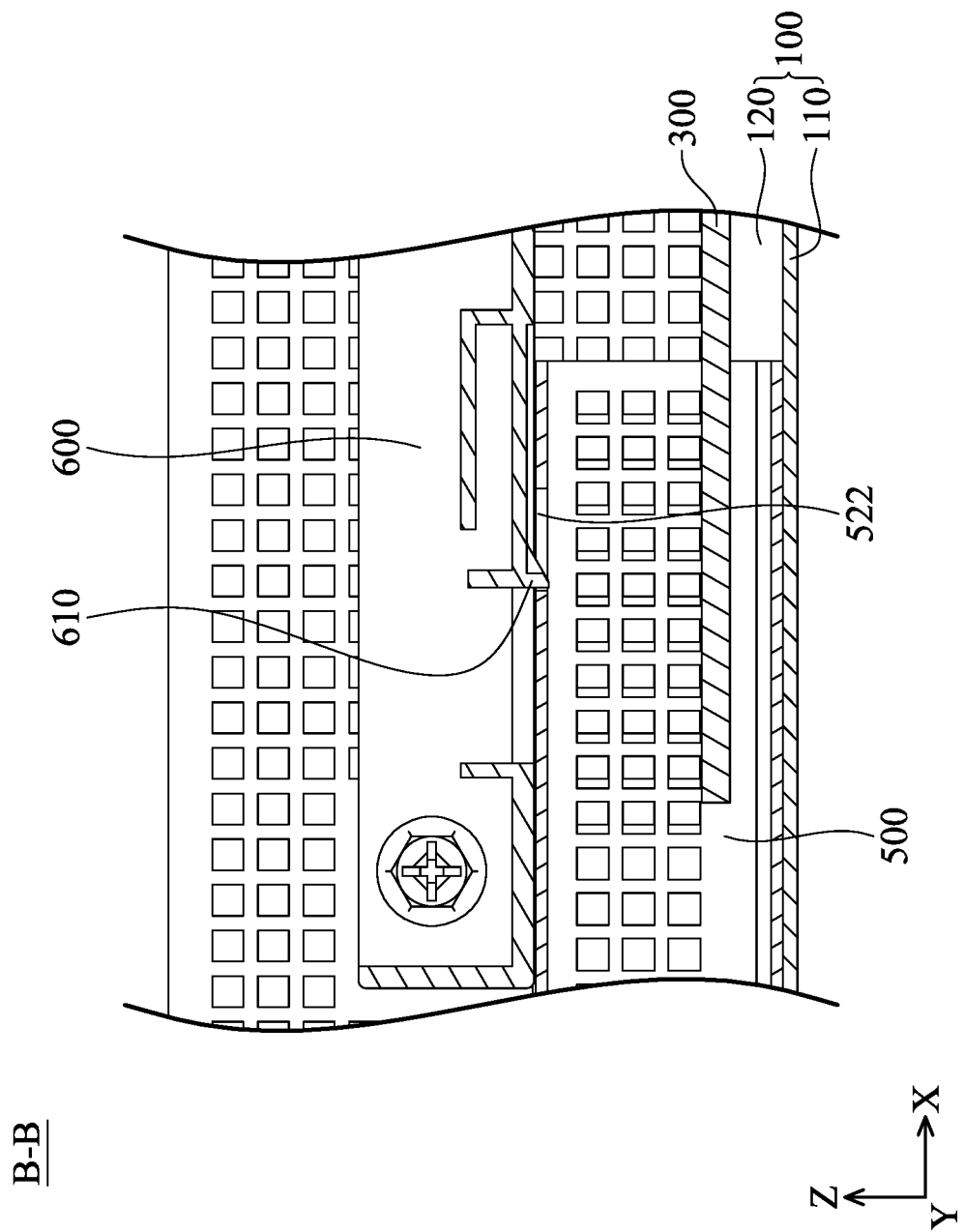
FIG. 7B is a cross-sectional view along line B-B in FIG. 7A.
Figure 7C:
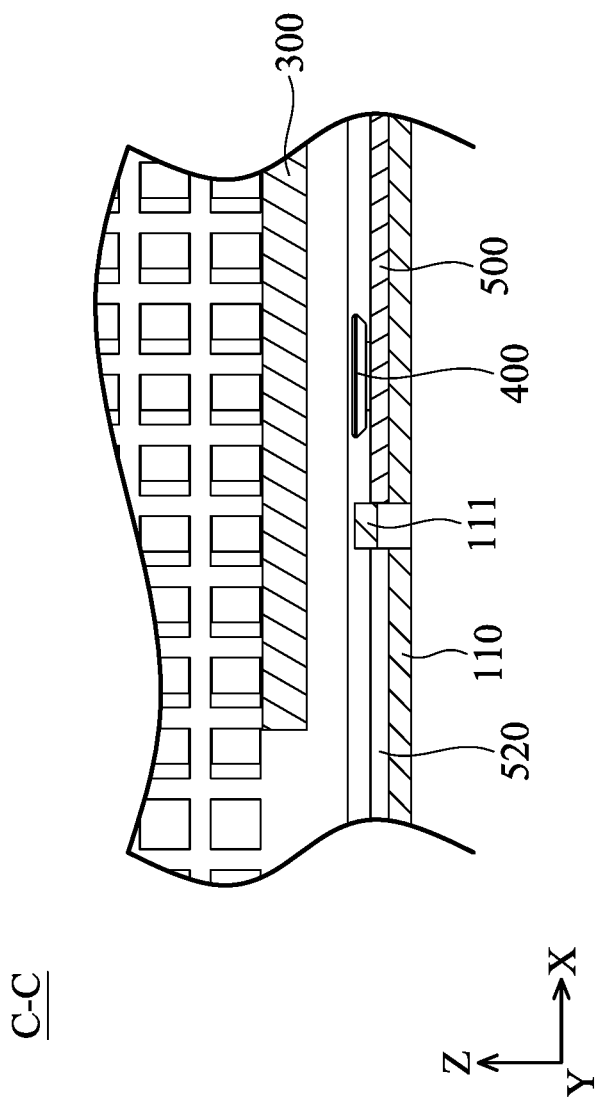
FIG. 7C is a cross-sectional view along line C-C in FIG. 7A.

As shown in FIG. 7B, when the sliding member 500 is in the first position, the restricting portion 610 of the fixed member 600 is joined to the engaged portion 522 of the sliding member 500. In detail, the spring sheet of the restricting portion 610 enters the recess of the engaged portion 522, so that the sliding member 500 can be affixed in the first position. Furthermore, as shown in FIG. 7C, the protrusion 111 on the bottom plate 100 contacts a side of the accommodating portion 520, so that the sliding member 500 cannot move toward the −X-axis.

In other words, in response to the sliding member 500 in the first position, the sliding member 500 covers the second region 121B, the restricting portion 610 is joined to the engaged portion 522, and the protrusion 111 contacts the sliding member 500 to restrict the movement of the sliding member 500 along the −X-axis.

Figure 8A:
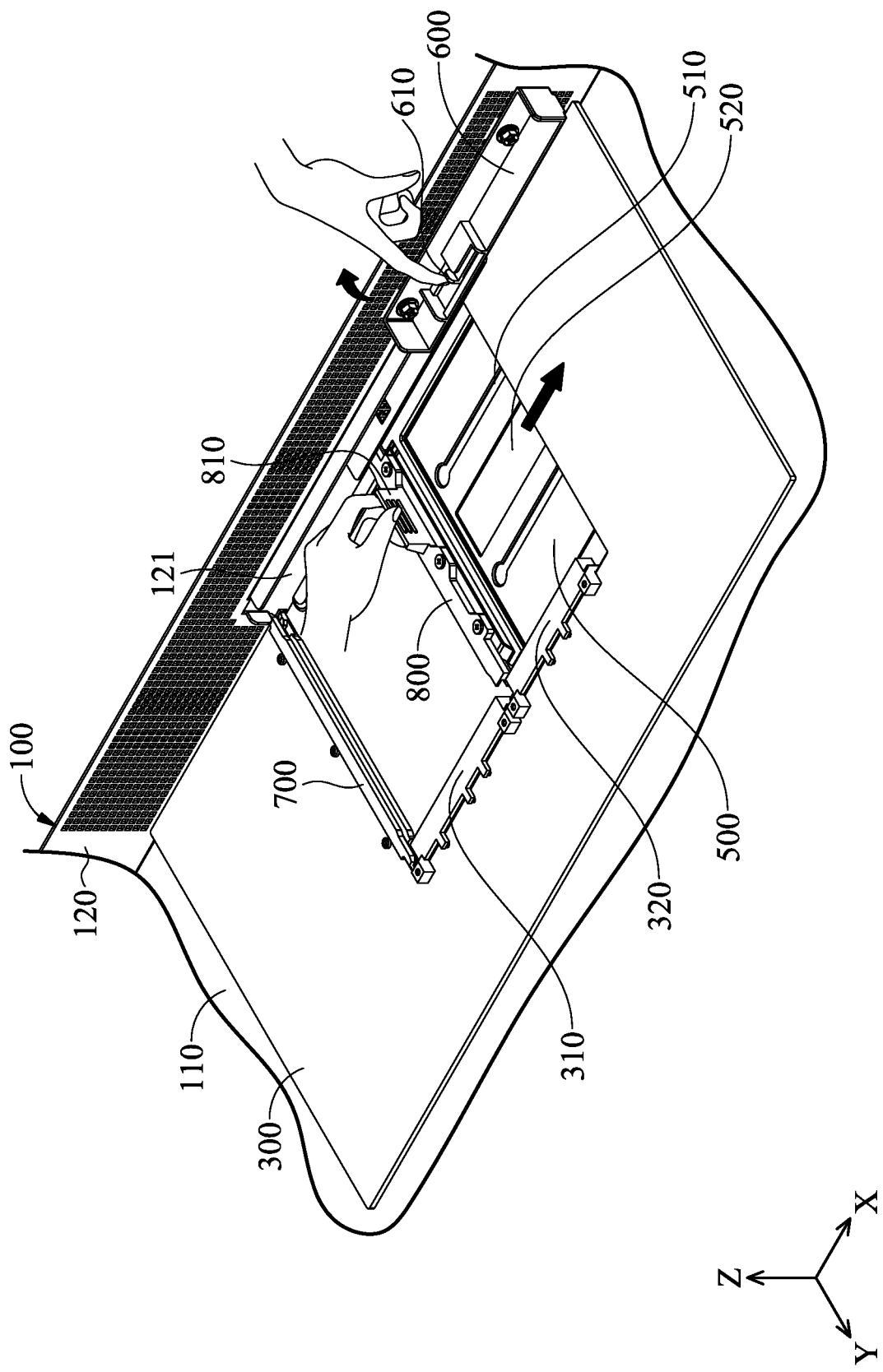
FIG. 8A is a schematic diagram showing a user moving the sliding member according to an embodiment of the invention.
Figure 8B:
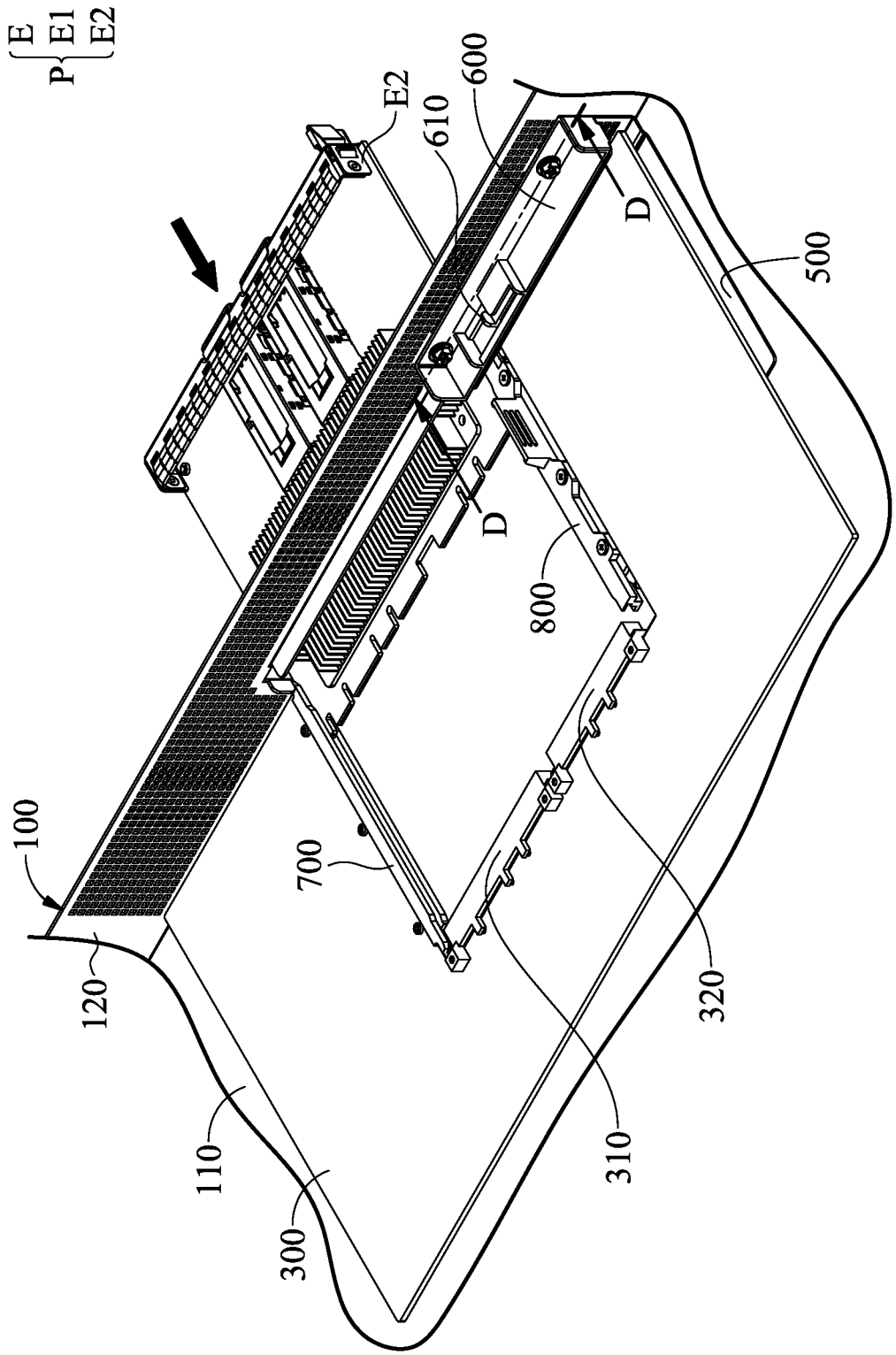
FIG. 8B is a schematic diagram of the sliding member in a second position according to an embodiment of the invention.

Referring to FIGS. 8A and 8B, when the user desires to connect the electronic member E2 to the first connecting port 310 and the second connecting port 320, he can pull the restricting portion 610 of the fixed member 600 to separate the restricting portion 610 from the engaged portion 522 of the sliding member 500 (i.e. to remove the spring from the recess). Simultaneously, the user can push the protruding portion 810, moving the second guiding member 800 and the sliding member 500 along the X-axis (the first direction), and the sliding member 500 moves from the first position to a second position, whereupon the sliding member 500 leaves the second region 121B of the inserting portion 121.

Therefore, when the sliding member 500 is in the second position, the first connecting port 310 and the second connecting port 320 are disposed between the first guiding member 700 and the second guiding member 800, and the sliding member 500 does not cover the inserting portion 121. The electronic member E2 can be guided by the guiding grooves of the first guiding member 700 and the second guiding member 800, and move along the Y-axis to connect the first connecting port 310 and the second connecting port 320.

Figure 8C:
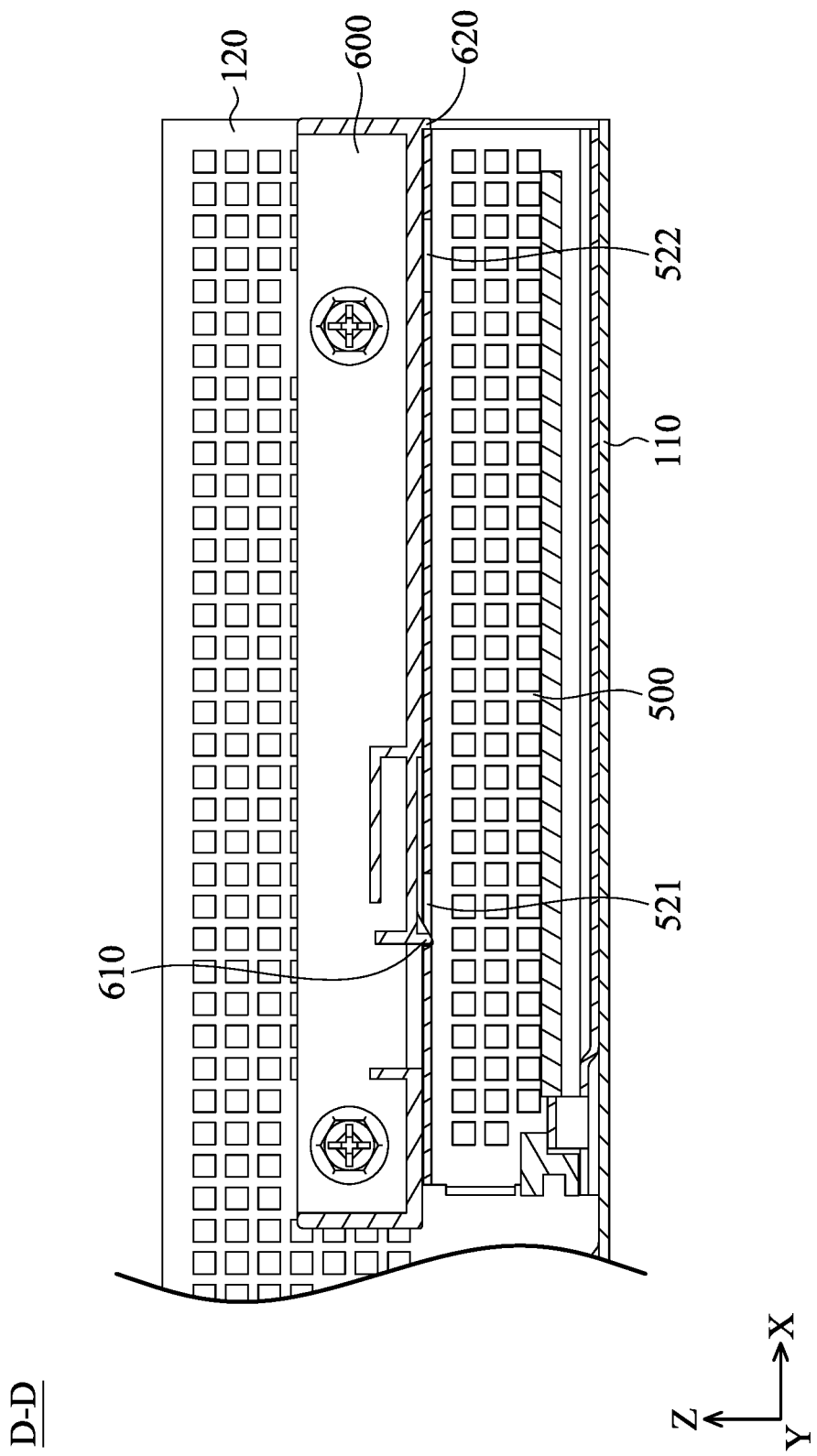
FIG. 8C is a cross-sectional view along line D-D in FIG. 8B.

As shown in FIG. 8C, when the sliding member 500 is in the second position, the restricting portion 610 of the fixed member 600 is joined to the engaged portion 521 of the sliding member 500. In detail, the spring sheet of the restricting portion 610 enters the recess of the engaged portion 521, so as to affix the sliding member 500 in the second position. Furthermore, the sliding member 500 contacts the blocking portion 620, so that the sliding member 500 cannot move toward the X-axis.

In other words, in response to the sliding member 500 in the second position, the sliding member 500 does not cover the second region 121B, the first connecting port 310 and the second connecting port 320 are disposed between the first guiding member 700 and the second guiding member 800, the restricting portion 610 is joined to the engaged portion 521, and the sliding member 500 contacts the blocking portion 620 to restrict the movement of the sliding member 500 along the X-axis (the first direction).

When the sliding member 500 is in the second position, and the user desires to connect the electronic member E1 to the first connecting port 310, he can release the engagement between the restricting portion 610 and the engaged portion 521, and push the sliding member 500 along the −X-axis (the second direction) from the second position to the first position.

For example, the first connecting port 310 can be a "4C" 140-pin connector, and the second connecting port 320 can be a "4C+" 168-pin connector. In some embodiments, the first connecting port 310 and the second connecting port 320 can be a PCI connector or a PCIe connector. Furthermore, in some embodiments, the restricting portion 610 of the fixed member 600 can be a recess, and the engaged portions 521 and 522 can be spring sheets.

Figure 9A:
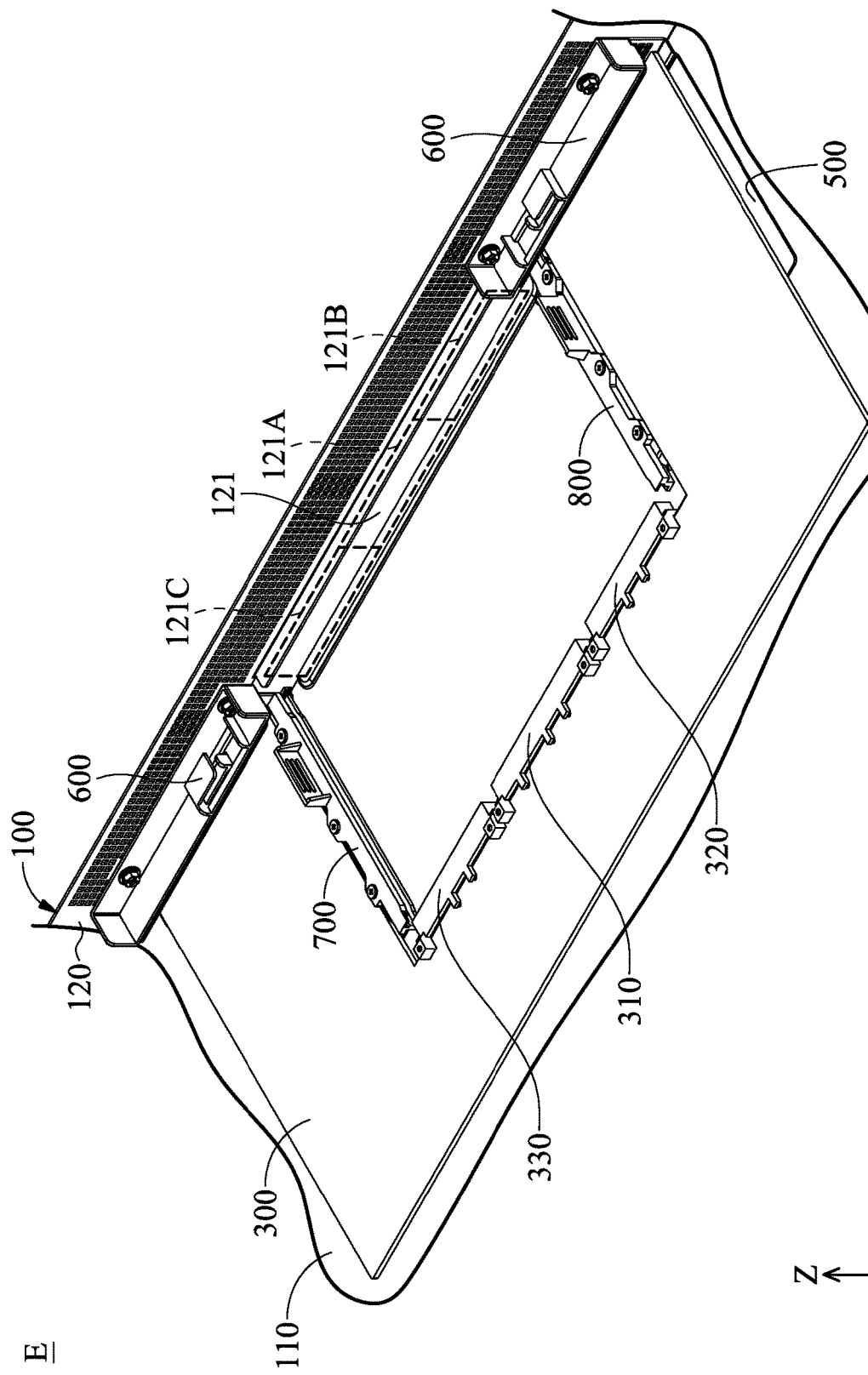
FIG. 9A is a schematic diagram of a connecting module according to another embodiment of the invention.
Figure 9B:
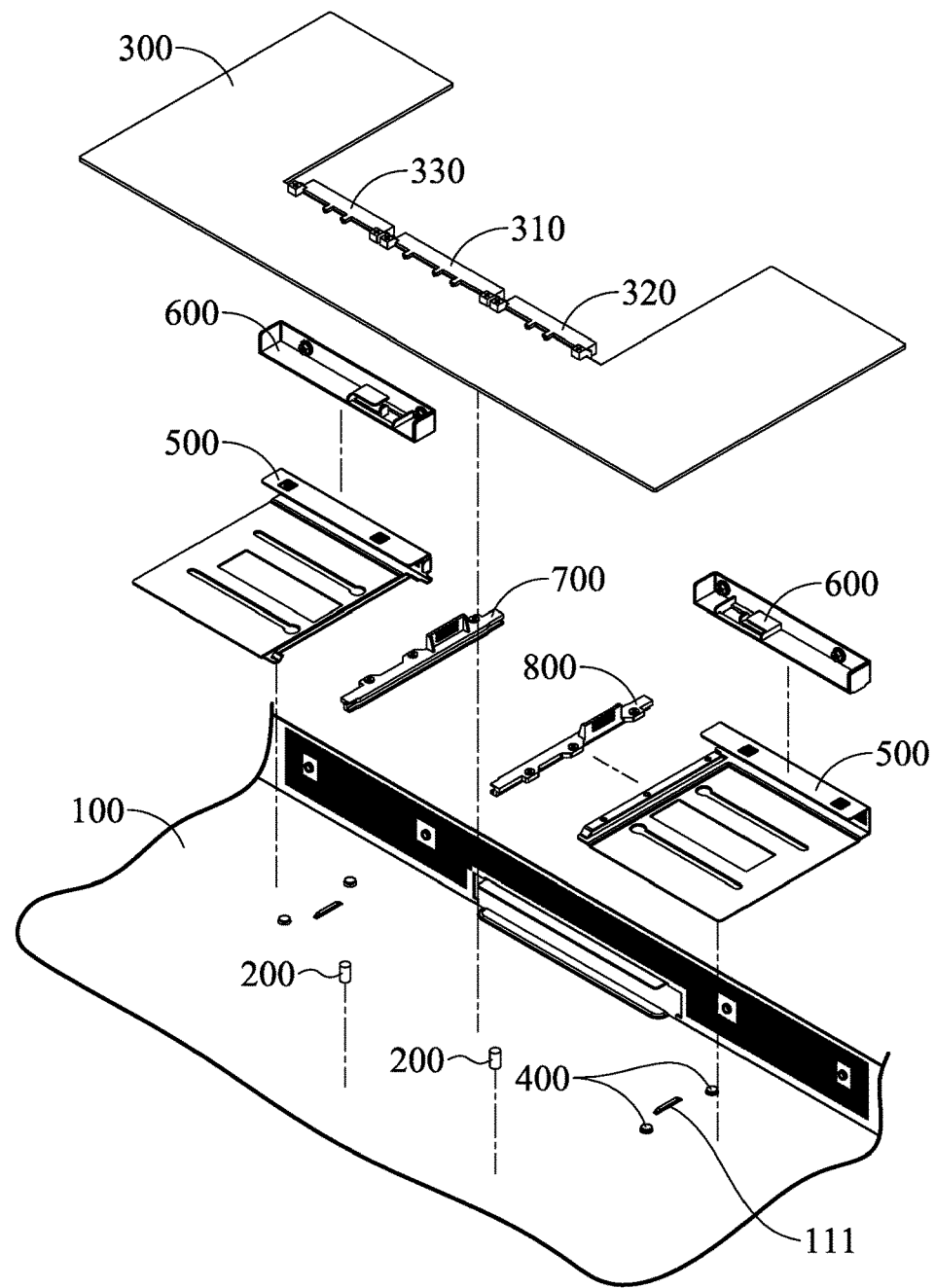
FIG. 9B is an exploded-view diagram of the connecting module according to another embodiment of the invention.

Referring to FIGS. 9A and 9B, in another embodiment, the connecting module E primarily includes a housing 100, a plurality of supporting members 200, a circuit board 300, at least one guiding pillar 400, two sliding members 500, two fixed members 600, a first guiding member 700, and a second guiding member 800.

Unlike the embodiment in FIGS. 1 and 2, the circuit board 300 in this embodiment has a first connecting port 310, a second connecting port 320, and a third connecting port 330. The inserting portion 121 can be divided into a first region 121A, a second region 121B, and a third region 121C, wherein the first region 121A, the second region 121B, and the third region 121C respectively correspond to the first connecting port 310, the second connecting port 320, and the third connecting port 330. The first connecting port 310 is disposed between the second connecting port 320 and the third connecting port 330.

Two sliding members are respectively disposed on the opposite sides of the second connecting port 320, and two fixed members 600 are respectively disposed on the opposite sides of the second connecting port 320. The structure and the connecting relationship of each sliding member 500 and each fixed member 600 are the same as the aforementioned embodiment. The first guiding member 700 and the second guiding member 800 are respectively disposed on the two slides 500. By the movements of two sliding members 500, two slides 500 can respectively cover the second region 121B and the third region 121C. More types of electronic member can be connected to the connecting module E.

In summary, a connecting module is provided, including a housing, a circuit board, a sliding member, a first guiding member, and a second guiding member. The housing has an inserting portion. The circuit board is disposed on the housing, and includes a first connecting port and a second connecting port. The sliding member is movably disposed on the housing. The first guiding member is disposed between the inserting portion and the first connecting port. The second guiding member is disposed on the sliding member and disposed between the inserting portion and the second connecting port.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A connecting module, configured to connect an electronic member and comprising:
    a housing, having an inserting portion;
    a circuit board, disposed on the housing, and having a first connecting port and a second connecting port;
    a sliding member, movably disposed on the housing;
    a first guiding member, disposed between the inserting portion and the first connecting port; and
    a second guiding member, disposed on the sliding member and disposed between the inserting portion and the second connecting port, wherein the electronic member is inserted via the inserting portion along an inserting direction, the sliding member is movable relative to the housing in a moving direction, and the moving direction is different from the inserting direction.

2. The connecting module as claimed in claim 1, wherein the inserting portion is divided into a first region and a second region, the first region corresponds to the first connecting port, and the second region corresponds to the second connecting port, wherein in response to the sliding member being in a second position, the sliding member does not cover the second region, and the second connecting port is disposed between the first guiding member and the second guiding member.

3. The connecting module as claimed in claim 2, wherein the connecting module further comprises a fixed member affixed to the housing and having a restricting portion, and the sliding member has an engaged portion, wherein in response to the sliding member being in a first position, the restricting portion is joined to the engaged portion.

4. The connecting module as claimed in claim 3, wherein the restricting portion is a spring sheet, and the engaged portion is a recess.

5. The connecting module as claimed in claim 3, wherein the restricting portion is a recess, and the engaged portion is a spring sheet.

6. The connecting module as claimed in claim 3, wherein the sliding member has an additional engaged portion, and in response to the sliding member being in the second position, the restricting portion is joined to the additional engaged portion.

7. The connecting module as claimed in claim 3, wherein the fixed member has a blocking portion, and in response to the sliding member being in the second position, the sliding member contacts the blocking portion to restrict the sliding member from moving in a first direction.

8. The connecting module as claimed in claim 7, wherein the housing has a protrusion, and in response to the sliding member being in the first position, the protrusion contacts the sliding member to restrict the sliding member to move in a second direction, wherein the second direction is opposite the first direction.

9. The connecting module as claimed in claim 1, wherein the sliding member has a guiding slot, and the connecting module further includes a guiding pillar disposed on the housing and movably accommodated in the guiding slot.

10. The connecting module as claimed in claim 9, wherein the guiding pillar has a T-shaped structure.

11. The connecting module as claimed in claim 1, wherein the first guiding member is affixed to the housing or the circuit board.

12. The connecting module as claimed in claim 1, wherein the second guiding member has a protruding portion, protruding from a top surface of the circuit board.

13. The connecting module as claimed in claim 1, wherein a gap is formed between the circuit board and the housing, and at least a portion of the sliding member is disposed in the gap.

14. The connecting module as claimed in claim 1, wherein the connecting module further comprises an additional sliding member movably disposed on the housing, and the first guiding member is disposed on the additional sliding member.

15. The connecting module as claimed in claim 14, wherein the circuit board further comprises a third connecting port, the inserting portion is divided into a first region, a second region, and a third region, the first region corresponds to the first connecting port, the second region corresponds to the second connecting port, and the third region corresponds to the third connecting port, wherein the additional sliding member can cover the third region.

16. The connecting module as claimed in claim 14, wherein the circuit board has a slot having a first side, a second side, and a third side, and the third side is connected to the first side and the second side, wherein the first guiding member is disposed on the first side, the first connecting port and the second connecting port are disposed on the third side, and the second guiding member is movably disposed between the first side and the second side.

17. The connecting module as claimed in claim 1, wherein the second guiding member is parallel to the first guiding member.

18. An electronic device, comprising:
a connecting module, comprising:
a housing, having an inserting portion;
a circuit board, disposed on the housing, and having a first connecting port and a second connecting port;
a sliding member, movably disposed on the housing;
a first guiding member, disposed between the inserting portion and the first connecting port; and
a second guiding member, disposed on the sliding member and situated between the inserting portion and the second connecting port; and
an electronic member, connected to the first connecting port or connected to the first and second connecting ports via the inserting portion along an inserting direction, wherein the sliding member is movable relative to the housing in a moving direction, and the moving direction is different from the inserting direction.

19. The electronic device as claimed in claim 18, wherein the inserting portion is divided into a first region and a second region, the first region corresponds to the first connecting port, and the second region corresponds to the second connecting port, wherein in response to the sliding member being in a first position, the sliding member covers the second region, and in response to the sliding member being in a second position, the sliding member does not cover the second region, and the second connecting port is disposed between the first guiding member and the second guiding member.

20. The electronic device as claimed in claim 19, wherein the connecting module further comprises a fixed member affixed to the housing and having a restricting portion, and the sliding member has an engaged portion and an additional engaged portion, wherein in response to the sliding member being in the first position, the restricting portion is joined to the engaged portion, and in response to the sliding member being in the second position, the restricting portion is joined to the additional engaged portion.

* * * * *